United States Patent
Gorlin et al.

(10) Patent No.: US 10,908,219 B2
(45) Date of Patent: Feb. 2, 2021

(54) BATTERY MANAGEMENT SYSTEM WITH MIXED ELECTRODE

(71) Applicant: Robert Bosch GmbH, Stuttgart (DE)

(72) Inventors: Yelena Gorlin, Menlo Park, CA (US); Anantharaman Subbaraman, Mountain View, CA (US); Reinhardt Klein, Mountain View, CA (US)

(73) Assignee: Robert Bosch GmbH, Stuttgart (DE)

( * ) Notice: Subject to any disclaimer, the term of this patent is extended or adjusted under 35 U.S.C. 154(b) by 72 days.

(21) Appl. No.: 16/416,524

(22) Filed: May 20, 2019

(65) Prior Publication Data

US 2020/0371161 A1    Nov. 26, 2020

(51) Int. Cl.
| | |
|---|---|
| *G01R 31/367* | (2019.01) |
| *H01M 10/42* | (2006.01) |
| *H01M 10/48* | (2006.01) |
| *G01R 31/371* | (2019.01) |
| *G01R 31/3842* | (2019.01) |
| *H01M 4/583* | (2010.01) |
| *H01M 10/44* | (2006.01) |

(52) U.S. Cl.
CPC ......... *G01R 31/367* (2019.01); *G01R 31/371* (2019.01); *G01R 31/3842* (2019.01); *H01M 4/583* (2013.01); *H01M 10/425* (2013.01); *H01M 10/44* (2013.01); *H01M 10/488* (2013.01); *H01M 2010/4271* (2013.01); *H01M 2010/4278* (2013.01); *H01M 2220/20* (2013.01)

(58) Field of Classification Search
None
See application file for complete search history.

(56) References Cited

U.S. PATENT DOCUMENTS

| | | |
|---|---|---|
| 7,518,339 B2 | 4/2009 | Schoch |
| 8,188,715 B2 | 5/2012 | Christensen et al. |
| 10,424,961 B1 * | 9/2019 | Maluf .................. G01R 31/378 |

(Continued)

OTHER PUBLICATIONS

M. N. Obrovac, L. Christensen, D. B. Le and J. R. Dahn, "Alloy Design for Lithium-Ion Battery Anodes," J. Electrochem. Soc., vol. 154, No. 9, pp. A849-A855, 2007.

(Continued)

*Primary Examiner* — Jermele M Hollington
(74) *Attorney, Agent, or Firm* — Maginot, Moore & Beck LLP

(57) ABSTRACT

A battery system in one embodiment includes a cell with an anode including graphite and a minor active material that displays an apparent thermodynamic hysteresis. A controller is operably connected to a memory which is configured to execute program instructions in the memory to perform a charge of the cell to a first potential, and a discharge of the cell from the first potential to generate a first discharge versus capacity curve. After a second charge of the cell to a second potential and a second discharge of the cell from the second potential to generate a second discharge versus capacity curve, the controller identifies a shift between the first discharge versus capacity curve and the second discharge versus capacity curve and updates a model of the cell based upon the identified shift. The controller then modifies at least one operating parameter of the cell based upon the updated model.

19 Claims, 5 Drawing Sheets

(56) References Cited

U.S. PATENT DOCUMENTS

| | | | |
|---|---|---|---|
| 2012/0105069 A1* | 5/2012 | Wang | G01R 31/392 |
| | | | 324/427 |
| 2017/0033572 A1* | 2/2017 | Becker | G01R 31/367 |
| 2018/0083461 A1 | 3/2018 | Ravi et al. | |
| 2019/0036356 A1 | 1/2019 | Subbaraman et al. | |
| 2019/0170829 A1* | 6/2019 | Srinivasan | G01R 31/396 |
| 2020/0006816 A1* | 1/2020 | Gorlin | H01M 10/48 |

OTHER PUBLICATIONS

R. Nagai, F. Kita, M. Yamada and H. Katayama, "Development of Highly Reliable High-capacity Batteries for Mobile Devices and Small- to Medium-sized Batteries for industrial Applications," Hitachi Review, vol. vol. 60, No. No. 1, pp. 28-32, 2011.

N. Nitta, F. Wu, J. T. Lee and G. Yushin, "Li-ion Battery Materials: Present and Future," Materials Today, vol. 18, No. 5, pp. 252-264, 2015.

* cited by examiner

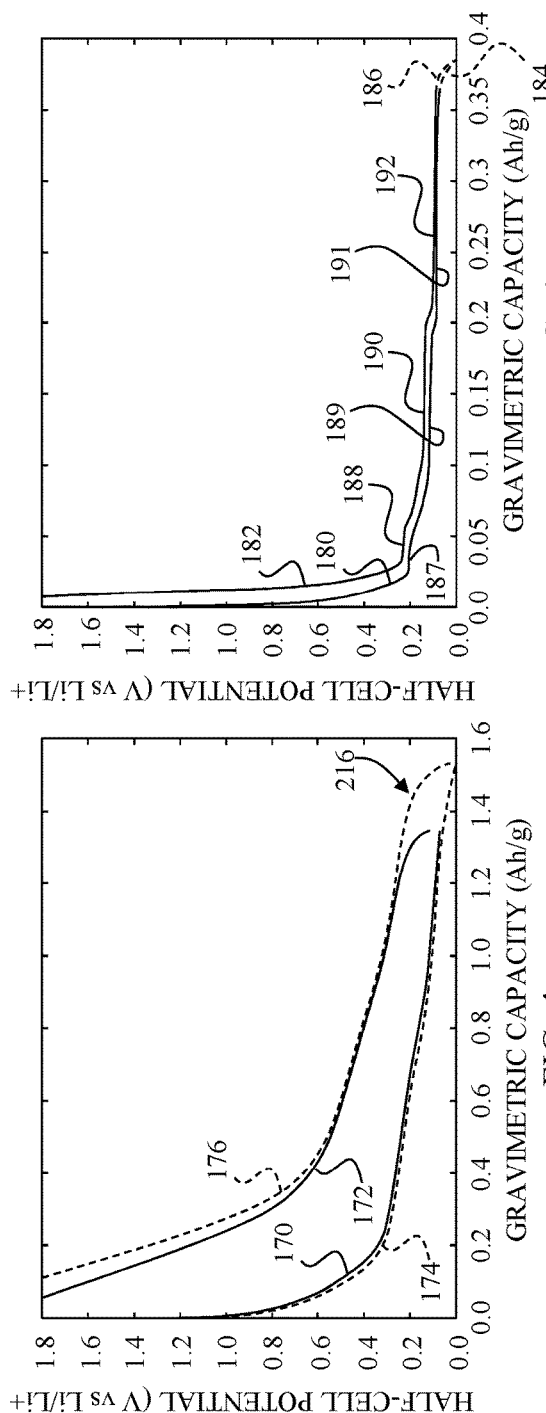
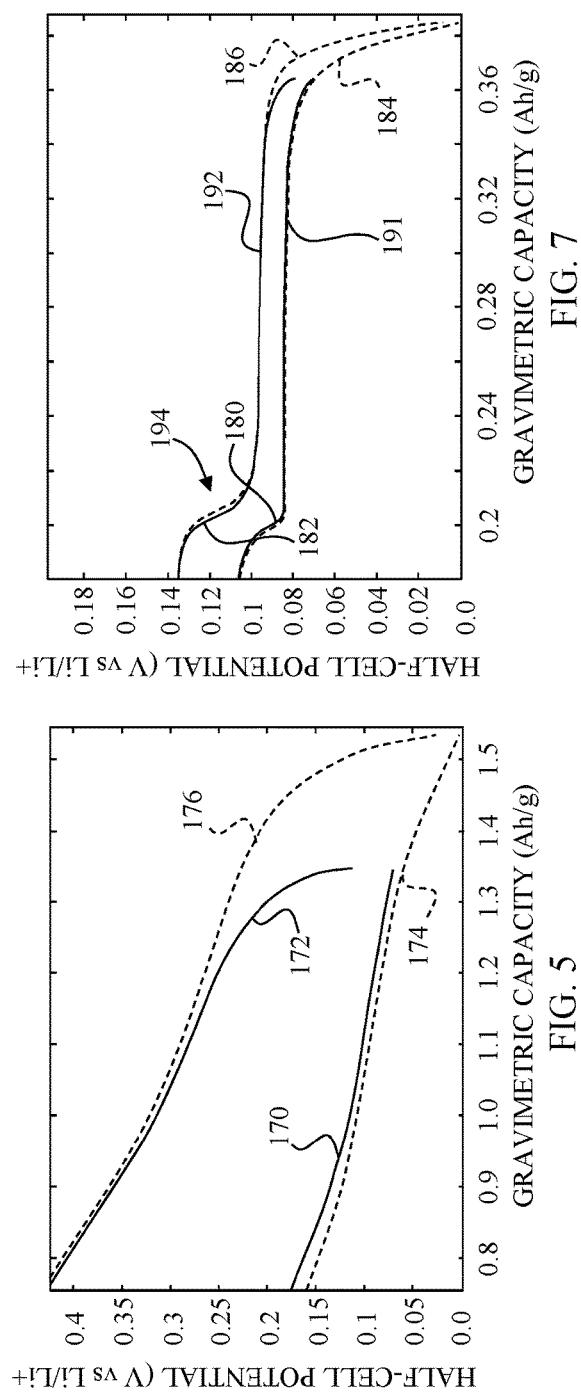

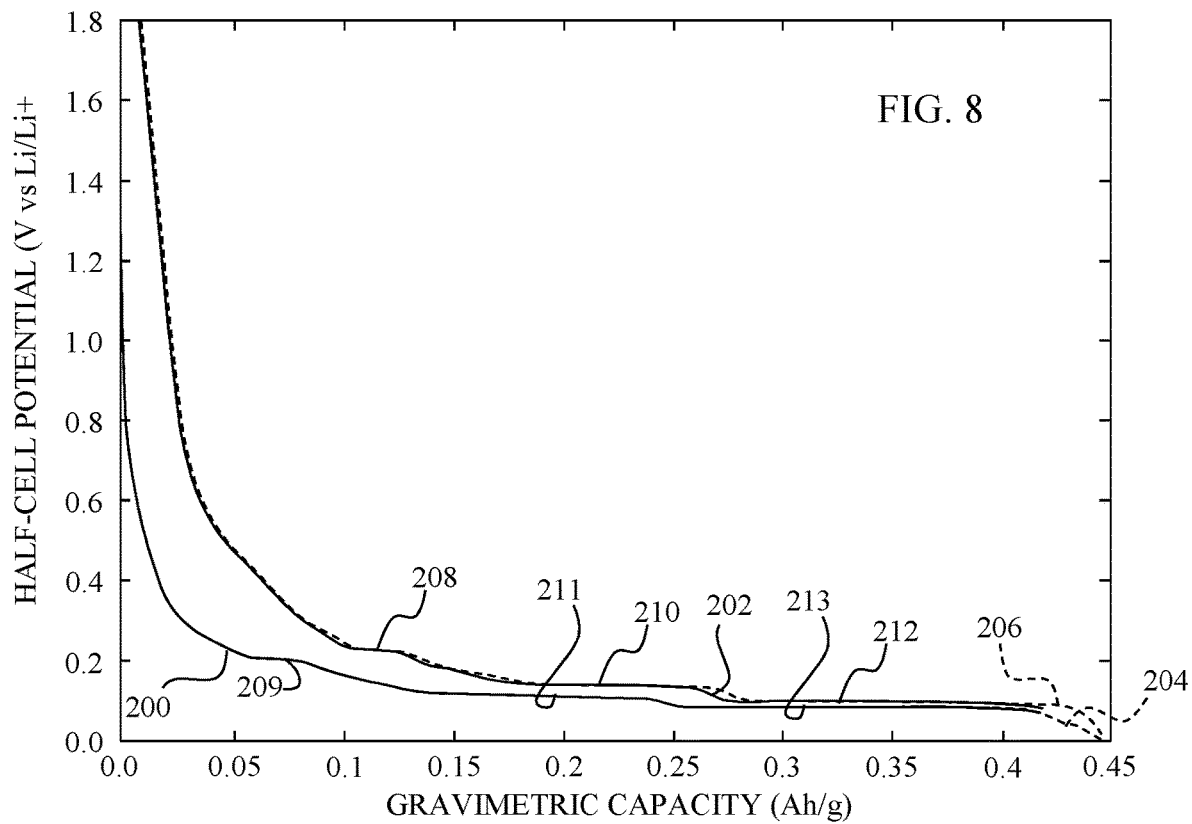
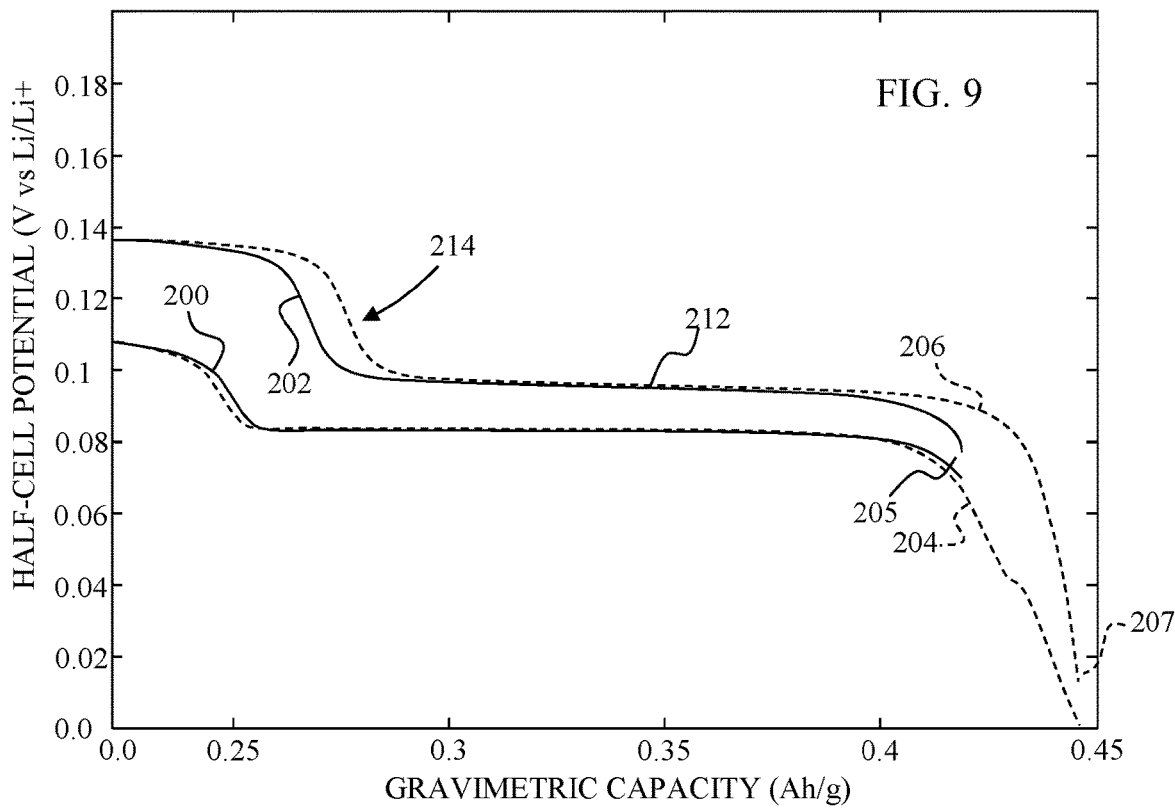

BATTERY MANAGEMENT SYSTEM WITH MIXED ELECTRODE

TECHNICAL FIELD

This disclosure relates generally to batteries, and more particularly to battery management systems for batteries including a material with apparent thermodynamic hysteresis as a minor component in a negative electrode.

BACKGROUND

A number of new battery chemistries are entering the market to provide capabilities required in specialized applications. At one time, the lithium-ion battery market was driven by the use of such batteries in portable electronics which require high energy but only limited life and power. More recently, other industries have focused on the use of batteries. By way of example, batteries are commonly incorporated into power tools and certain types of hybrid-electric vehicles. Each new industry requires different performance characteristics. Certain applications such as automotive applications require battery stability both in terms of battery safety for large packs and long life (at least 10 to 15 years).

Lithium-ion batteries have become the industry standard in both electric mobility and portable electronics applications. Lithium-ion batteries operate based on the movement of lithium ions between the negative electrode, also known as the "anode", and the positive electrode, also known as the "cathode". In commercially available devices, negative electrodes are based on graphite, a carbon material that intercalates lithium and has gravimetric capacity of 372 mAh/$g_{graphite}$. Silicon has been identified as a potential negative electrode material due to its ability to alloy with lithium and achieve gravimetric density of 3579 mAh/$g_{Si}$. However, at present, using pure silicon as a negative electrode has proven to be challenging because of the high volume expansion rates occurring during the lithiation process of pure silicon and the associated apparent thermodynamic hysteresis which is evidenced in the potential versus capacity curve for such devices. Nonetheless, some batteries incorporate a small amount of pure silicon or materials containing silicon, such as silicon oxide (SiO) or silicon alloys ($SiB_3$, $Si_2Fe$, $TiSi_2$ and others), into graphite-based negative electrodes to increase the gravimetric capacity of the negative electrode above the level of pure graphite.

When batteries are incorporated into vehicular applications, a battery management system (BMS) is coupled to the battery, such as a lithium-ion battery, to control the operation of the battery. A BMS generally includes a controller that executes program instructions stored in a memory to operate the battery to control the speed at which the battery charges and discharges. The charge and discharge set points are based on a model of the operating parameters of the battery which may be provided with the vehicle or which may be maintained remotely from the vehicle. To ensure proper set points are selected, it is necessary to understand various battery parameters which are not easily obtained including state of charge (SOC), state of health (SOH), and battery capacity. It is also useful to present one or more of SOC, SOH, and battery capacity to a user so as to preclude inopportune depletion of the battery.

What is needed therefore is an improved BMS. It would be advantageous if the BMS controlled the battery based upon a measurable electrochemical feature of the battery which accurately identifies battery SOC, and/or SOH, and/or capacity.

SUMMARY

According to one embodiment, a battery system includes a cell including a cathode and an anode, the anode including a carbon-based active material and a minor active material that displays an apparent thermodynamic hysteresis in a potential versus capacity curve. The system includes a controller operably connected to a memory which is configured to execute program instructions in the memory to identify the charging strategy for the battery. One of the steps in identification of the charging strategy for the battery is to perform a first charge of the cell to a first potential, and then perform a first discharge of the cell from the first potential to generate a first discharge versus capacity curve. The controller is further configured to execute the program instructions to perform, either before or after the first charge and discharge, a second charge of the cell to a second potential and then perform a second discharge of the cell from the second potential to generate a second discharge versus capacity curve. The controller then identifies a shift between the first discharge versus capacity curve and the second discharge versus capacity curve and updates a model of the cell based upon the identified shift. At least one operating parameter of the cell is modified based upon the updated model and stored in the memory. The cell is then operated by the controller based upon the stored modified operating parameter.

In one or more embodiments, the controller is further configured to execute the program instructions to parameterize a relationship between the shift and a difference in voltage between the first potential and the second potential, wherein the first potential is about 70 mV versus lithium/lithium+ and the second potential is lower than 70 mV versus lithium/lithium+. As used herein, the word "about" when modifying a number means at least within ten percent of the stated number, preferably within five percent of the stated number, and most preferably within two percent of the stated number.

In one or more embodiments, the at least one operating parameter includes a capacity of the cell, and the controller is further configured to execute the program instructions to determine a state of charge of the cell based upon the modified capacity.

In one or more embodiments the system further includes a display and the controller is further configured to execute the program instructions to display the determined state of charge on the display.

In one or more embodiments the at least one operating parameter includes a charging voltage cutoff, and the system further includes a voltage meter operably connected to the controller and the cell, wherein the controller is further configured to execute the program instructions to terminate a third charge of the cell based upon the charging voltage cutoff.

In one or more embodiments the at least one operating parameter includes a charging current cutoff and the system further includes a current meter operably connected to the controller and the cell, wherein the controller is further configured to execute the program instructions to terminate a third charge of the cell based upon the charging current cutoff.

In one or more embodiments the system includes a coulomb counter. The controller is configured to execute the program instructions to identify a first number of coulombs discharged between initiation of the first discharge and an end of a first discharge plateau of the first discharge versus capacity curve, and identify a second number of coulombs discharged between initiation of the second discharge and an end of a second discharge plateau of the second discharge versus capacity curve. The controller then compares the first number of coulombs to the second number of coulombs, and estimates an amount of coulombs associated with the minor active material resulting from charging the cell to the second potential.

In one or more embodiments the minor active material includes silicon and the carbon-based active material is graphite.

In one or more embodiments, a method of operating a battery system includes performing a first charge of a cell including a cathode and an anode, the anode including a carbon-based active material and a minor active material that displays an apparent thermodynamic hysteresis in a potential versus capacity curve, to a first potential, and then performing a first discharge of the cell from the first potential under the control of a controller executing program instructions stored in a memory to generate a first discharge versus capacity curve. The method further includes performing, either before or after the first charge and discharge, a second charge of the cell to a second potential and then performing a second discharge of the cell from the second potential to generate a second discharge versus capacity curve. The method includes identifying with the controller a shift between the first discharge versus capacity curve and the second discharge versus capacity curve, updating a model of the cell stored in the memory based upon the identified shift, and modifying with the controller at least one operating parameter of the cell based upon the updated model. The at least one modified operating parameter of the cell is stored in the memory and the cell is operated under the control of the controller based upon the stored at least one modified operating parameter.

In accordance with one or more embodiments, a method of operating a battery system further includes parameterizing a relationship between the shift and a difference in voltage between the first potential and the second potential, wherein the first potential is about 70 mV versus lithium/lithium+ and the second potential is lower than 70 mV versus lithium/lithium+.

In accordance with one or more embodiments the stored at least one modified operating parameter includes a modified capacity of the cell, and operating the cell under the control of the controller based upon the stored at least one modified operating parameter includes determining a state of charge of the cell based upon the stored modified capacity.

In accordance with one or more embodiments, a method includes displaying the determined state of charge on a display.

In accordance with one or more embodiments the stored at least one modified operating parameter includes a modified charging voltage cutoff, and operating the cell under the control of the controller based upon the stored at least one modified operating parameter includes terminating a third charge of the cell based upon the modified charging voltage cutoff.

In accordance with one or more embodiments the stored at least one modified operating parameter includes a modified charging current cutoff, and operating the cell under the control of the controller based upon the stored at least one modified operating parameter includes terminating a third charge of the cell based upon the modified charging current cutoff.

In accordance with one or more embodiments, a method includes identifying a first number of coulombs discharged between initiation of the first discharge and an end of a first discharge plateau of the first discharge versus capacity curve, and identifying a second number of coulombs discharged between initiation of the second discharge and an end of a second discharge plateau of the second discharge versus capacity curve. The method includes comparing the first number of coulombs to the second number of coulombs, and estimating an amount of coulombs associated with the minor active material resulting from charging the cell to the second potential.

In accordance with one embodiment, a battery system includes a cell including a cathode and an anode, the anode including a carbon-based active material and a minor active material that displays an apparent thermodynamic hysteresis in a potential versus capacity curve. The battery system further includes a memory including program instructions stored therein and a controller operably connected to the memory and configured to execute the program instructions. Execution of the program instructions is accomplished to perform a first charge of the cell to a first potential, perform a first discharge of the cell from the first potential to generate a first discharge versus capacity curve, perform a second charge of the cell to a second potential, perform a second discharge of the cell from the second potential to generate a second discharge versus capacity curve, and identify a shift between the first discharge versus capacity curve and the second discharge versus capacity curve. Once the shift has been identified, the controller executes the program instructions to modify at least one operating parameter based upon the identified shift, and store the at least one modified operating parameter of the cell in the memory. The controller then executes the program instructions to operate the cell under the control of the controller based upon the stored at least one modified operating parameter.

In accordance with one or more embodiments, the stored at least one modified operating parameter is a charging limit.

In accordance with one or more embodiments, the stored at least one modified operating parameter is a charging strategy.

BRIEF DESCRIPTION OF THE DRAWINGS

FIG. 4 is a graph of lithiation and delithiation versus capacity curves for a silicon oxide electrode showing a lithiation/delithiation curve wherein lithiation is terminated at about 70 mV versus lithium/lithium+, and a lithiation/delithiation curve wherein lithiation is terminated at less than about 70 mV versus lithium/lithium+.

FIG. 5 is a magnified view of a portion of the graph of FIG. 4.

FIG. 6 is a graph of lithiation and delithiation versus capacity curves for a graphite electrode showing a lithiation/delithiation curve wherein lithiation is terminated at about 70 mV versus lithium/lithium+, and a lithiation/delithiation curve wherein lithiation is terminated at less than about 70 mV versus lithium/lithium+.

FIG. 7 is a magnified view of a portion of the graph of FIG. 6.

FIG. 8 is a graph of lithiation and delithiation versus capacity curves for an electrode including graphite and a minor active material in the form of silicon oxide showing a lithiation/delithiation curve wherein lithiation is terminated at about 70 mV versus lithium/lithium+, and a lithiation/delithiation curve wherein lithiation is terminated at less than about 70 mV versus lithium/lithium+.

FIG. 9 is a magnified view of a portion of the graph of FIG. 8.

DETAILED DESCRIPTION

For the purposes of promoting an understanding of the principles of the embodiments described herein, reference is now made to the drawings and descriptions in the following written specification. No limitation to the scope of the subject matter is intended by the references. This disclosure also includes any alterations and modifications to the illustrated embodiments and includes further applications of the principles of the described embodiments as would normally occur to one skilled in the art to which this document pertains.

Various operations may be described as multiple discrete actions or operations in turn, in a manner that is most helpful in understanding the claimed subject matter. However, the order of description should not be construed as to imply that these operations are necessarily order dependent. In particular, these operations in some embodiments are performed in a different order than the described embodiment. Various additional operations are performed and/or described operations are omitted in additional embodiments.

The terms "comprising," "including," "having," and the like, as used with respect to embodiments of the disclosure, are synonymous. As used herein, the word "about" when modifying a number means at least within ten percent of the stated number, preferably within five percent of the stated number, and most preferably within two percent of the stated number.

The embodiments of the disclosure discussed below are applicable to any desired battery chemistry which includes an anode incorporating a material which exhibits an apparent thermodynamic hysteresis as a minor component. Some examples refer to lithium-ion batteries for illustrative purposes. As used herein, the term "lithium-ion battery" refers to any battery which includes lithium as an active material. In particular, lithium-ion batteries include, without limitation, lithium based liquid electrolytes, solid electrolytes, gel electrolytes, and batteries commonly referred to as lithium-polymer batteries or lithium-ion-polymer batteries. As used herein, the term "gel electrolyte" refers to a polymer infused with a liquid electrolyte.

Figures 1, 3:
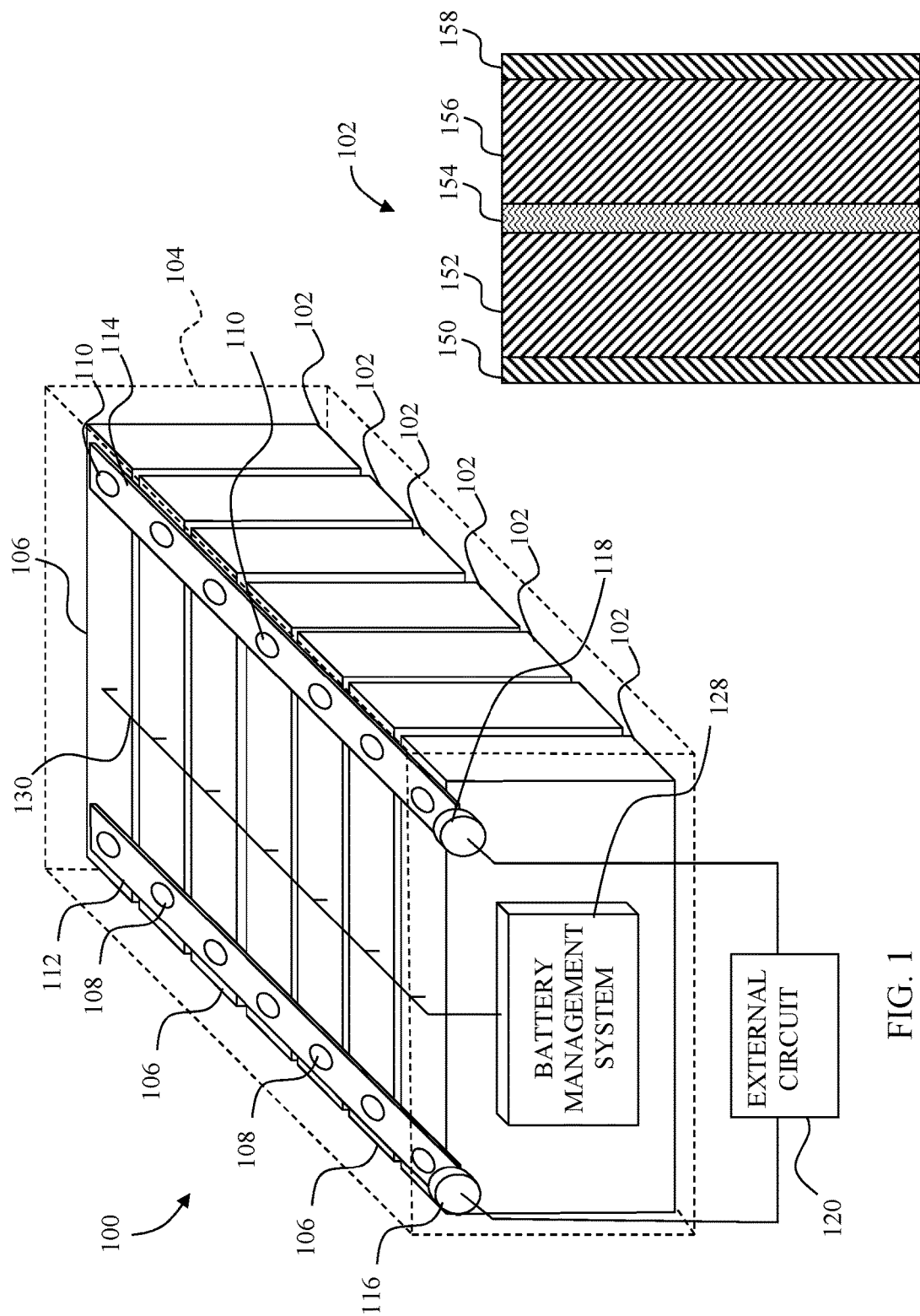
FIG. 1 is a schematic view of a battery pack according to the disclosure.
FIG. 3 is a schematic view of a battery cell of the battery pack of FIG. 1 having an anode with a carbon-based active material such as graphite with lithiation/delithiation potential below 0.2 V versus Li/Li+ and a minor active material that displays an apparent thermodynamic hysteresis in a potential versus capacity curve.

Referring now to FIG. 1, a battery pack 100 includes a plurality of battery cells 102 arranged in a pack housing 104. Each of the battery cells 102 includes a cell housing 106, from which a positive terminal 108 and a negative terminal 110 are exposed. In one embodiment of a parallel arrangement, the positive terminals 108 are connected to one another by a current collector 112, and the negative terminals 110 are connected to one another by a different current collector 114. In another embodiment, the positive terminals 108 are connected to adjacent negative terminals 110 by a current collector to provide a series connection. The current collectors 112/114 are connected to respective positive and negative battery pack terminals 116 and 118, which connect to an external circuit 120.

The external circuit 120 in one embodiment includes the electrical system of a vehicle in which the battery pack is located. The vehicular electrical system includes typical loads such as a motor, lights, navigation system, vehicular information and entertainment system, etc. Additionally, the external circuit provides for charging of the battery pack 100. To this end the motor in some embodiments is configured as a regenerative braking system. The external circuit 120 further includes an external charging connection (not shown). In some embodiments, the external circuit 120 is a test bed circuit and/or resistor bank.

Figure 2:
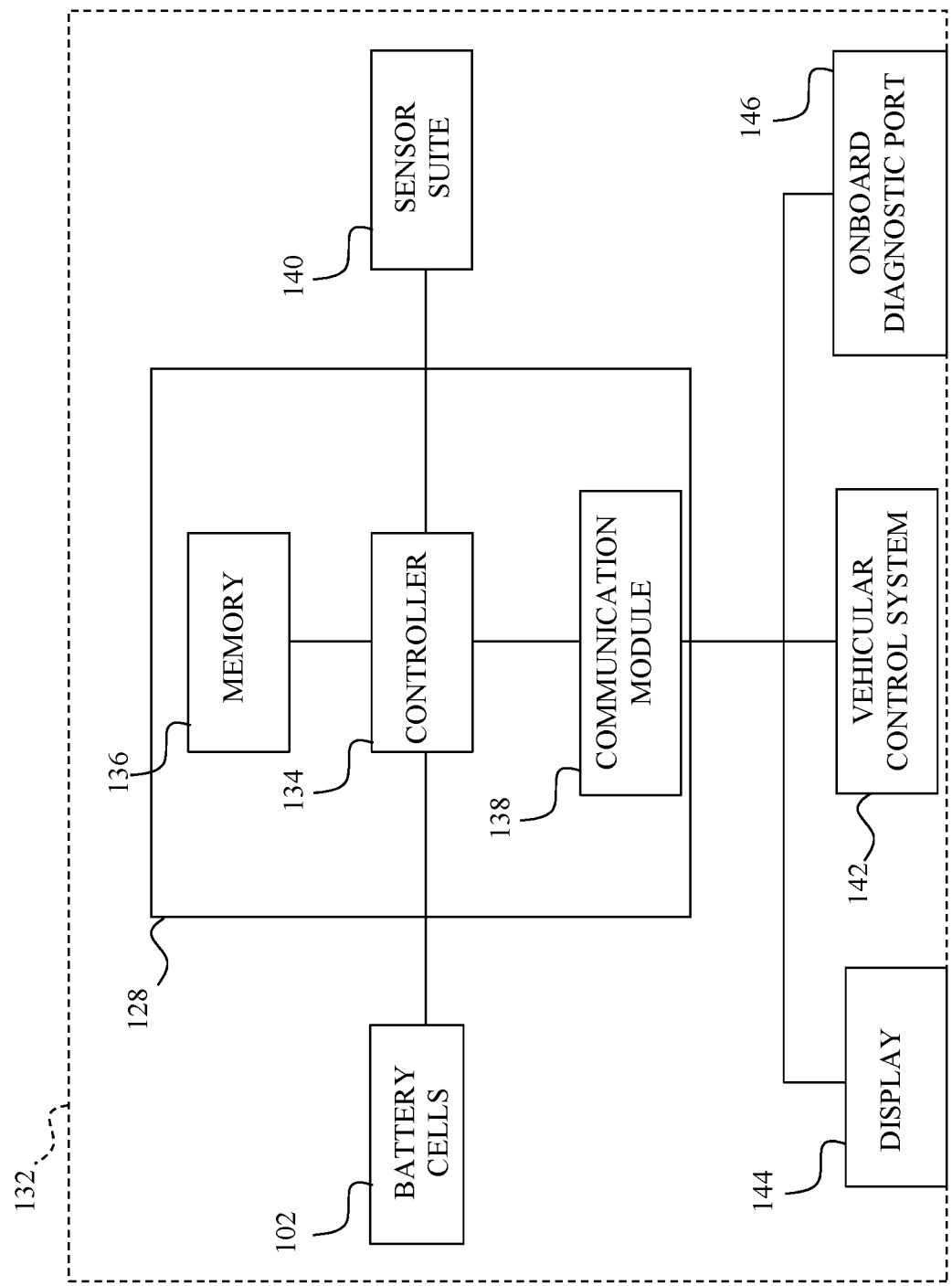
FIG. 2 is a schematic view of a system including a battery management system which controls the battery pack of FIG. 1.

In the embodiment of FIG. 1, the battery pack 100 includes a battery management system (BMS) 128. The BMS 128 is operably connected to each of the battery cells 102 by a control line 130. The BMS 128 is described in further detail with reference to FIG. 2 which shows the BMS 128 incorporated into a system 132 such as an automobile. In other embodiments, the system 132 is a test bed or other experimental system. The BMS 128 includes a controller 134, a memory 136, and a communication module 138. The controller 134 is implemented in various embodiments with general or specialized programmable processors that execute programmed instructions which are stored in the memory 136. In some embodiments at least some of the functionality of the controller 134 is provided by a vehicular control system 142 and/or remotely from the system 132 such as by a remote controller located at a charging station, a service center, a manufacturing center, etc. Thus, in some embodiments, the controller 134 is embodied as multiple controllers which are located at the battery and/or remotely from the battery 102 and/or the system 132.

The instructions and data required to perform the programmed functions are stored in the memory 136 along with a model of the battery 100 and/or cell 102. In some embodiments, the memory 136 is embodied as a plurality of memories which in some embodiments include one or more memories remote from the BMS 128. The processors, the memory, and communication module 138 or other interface circuitry configure the controller 134 to operate the battery pack 100 to charge and discharge the battery within a desired charge and discharge rate. The processors, the memory, and interface circuitry components in various embodiments are provided on a printed circuit card or provided as a circuit in an application specific integrated circuit (ASIC). In some embodiments, the circuits are implemented with discrete components or circuits provided in VLSI circuits. The circuits described herein are also implemented with a combination of processors, ASICs, discrete components, or VLSI circuits. Further discussion of a BMS an can be found, for example, in U.S. Pat. No. 8,188,715 which issued May 29, 2012, the contents of which are hereby incorporated by reference in their entirety.

In addition to the battery cells 102, the controller 134 is operably connected to a sensor suite 140. The sensor suite 140 includes various sensors which are used to ascertain operating conditions of the battery cells 102 including one or more temperature sensors, voltage sensors, and current/coulomb sensors. In some embodiments, each battery cell 102 is associated with a respective dedicated sensor suite 140 which is operably connected to the battery cell 102. The sensor suites 140 in these embodiments include one or more temperature sensors, voltage sensors, and current/coulomb sensors which is configured to obtain data for each individual cell.

The controller 134 in this embodiment is further operably connected through the communication module 138 to a vehicular control system 142, a display 144, and an onboard diagnostic port 146. The communication module 138 in various embodiments is configured to wirelessly communicate with one or more of the vehicular control system 142, the display 144, and the onboard diagnostic port 146.

As shown in FIG. 3, each battery cell 102 in one embodiment includes a positive electrode current collector 150, a positive electrode layer 152, a separator layer 154 which is omitted in some embodiments, a negative electrode 156, and a negative electrode current collector 158. In some embodiments, multiple layers of the battery cell 102 are stacked on top of one another so as to form an electrode stack. In other embodiments, the battery cell 102 is wound around itself in a spiral shape so as to form what is known as a "jelly-roll" or "Swiss-roll" configuration. In some embodiments, additional layers, e.g., protective layers, are provided.

The positive electrode current collector 150 electrically connects the positive terminal 108 of the battery cell 102 with the positive electrode 152 so as to enable flow of electrons between the external circuit 120 and the positive electrode 152. Likewise, the negative electrode current collector 158 electrically connects the negative terminals 110 with the negative electrode layer 156.

When the battery pack 100 is connected to the external circuit 120 that is powered by the battery pack 100, lithium ions are separated from electrons in the negative electrode 156. The lithium ions travel through the separator 154 and into the positive electrode 152. The free electrons in the battery pack 100 flow from the negative electrode 156, through the negative electrode current collector 158, to the negative terminals 110 of the battery cells 102. The electrons are then collected by the battery pack current collector 114 and transported to the battery pack terminal 118. The electrons flow through the external circuit 120 so as to provide electrical power the external circuit 120, and then pass through the positive battery pack terminal 116, and back into the battery cells 102 via the positive terminals 108. Connecting the battery pack 100 to an external circuit that charges the battery pack 100 results in the opposite flows of electrons and lithium ions.

In the illustrated embodiment, the negative electrode layer 156 includes a main active material and a minor active material that displays an apparent thermodynamic hysteresis in the potential versus capacity curve. As used herein, the term "main active material" means an active material which provides at least 50% of the electrode lithiation capacity. In some embodiments, the main active material provides at least 80 percent of the electrode lithiation capacity. In some embodiments the main active material provides about 94 percent of the electrode lithiation capacity. As used herein the term "minor active material" means an active material which provides less than 50% of the lithiation capacity of the electrode. In some embodiments the minor active material provides less than 20% of the lithiation capacity of the electrode. In some embodiments the minor active material provides about 6% of the lithiation capacity of the electrode.

The BMS 128 uses measurable electrochemical features which result from the incorporation in the negative electrode layer 156 of a minor active material that displays an apparent thermodynamic hysteresis in the potential versus capacity curve in determining various operating characteristics of the battery pack 100. The measurable electrochemical features are explained with reference to FIGS. 4-9.

The line 170 in FIG. 4 depicts the half-cell potential (V versus Li/Li+) of an SiO electrode with a total lithiation capacity of 1530 mAh/$g_{SiO}$ as the electrode is charged from an initial half-cell potential of about 1.2 V versus Li/Li+ to 0.07 V versus Li/Li+ resulting in a gravimetric capacity of about 1.35 Ah/$g_{SiO}$. The line 172 depicts the half-cell potential (V versus Li/Li+) of the SiO electrode as it is discharged following the 0.07 V versus Li/Li+ charge. The line 174 depicts the half-cell potential (V versus Li/Li+) of the SiO electrode as it is charged from an initial half-cell potential of about 1.2 V versus Li/Li+ to 0.001 V versus Li/Li+ resulting in a gravimetric capacity of about 1.53 Ah/$g_{SiO}$. The line 176 depicts the half-cell potential (V versus Li/Li+) of the SiO electrode as it is discharged following the 0.001 V versus Li/Li+ charge.

FIG. 5 is an expanded view of the end of the charge curves and the initial portion of the discharge curves of FIG. 4. From FIGS. 4 and 5 it is shown that the additional charge to 0.001 V versus Li/Li+ resulted in an additional capacity of 190 mAh/$g_{SiO}$ which amounts to about 12% of the total capacity of the electrode when a full state of charge (SOC) of the electrode is defined to be 0.070 mV which corresponds to a $Li_{3.3}Si$ stoichiometry for the electrochemically active Si species of the SiO. Additionally, while some divergence is observed between the discharge line 172 and the discharge line 176 once capacity falls below about 0.5 Ah/$g_{SiO}$ (FIG. 4), there is very little divergence between 0.5 Ah/$g_{SiO}$ and 1.2 Ah/$g_{SiO}$.

Referring now to FIG. 6, the line 180 depicts the half-cell potential (V versus Li/Li+) of a graphite electrode with a total lithiation capacity of 370 mAh/$g_{Graphite}$ as the electrode is charged from an initial half-cell potential of about 1.25 V versus Li/Li+ to 0.07 V versus Li/Li+ resulting in a gravimetric capacity of about 0.36 Ah/$g_{Graphite}$. The line 182 depicts the half-cell potential (V versus Li/Li+) of the graphite electrode as it is discharged following the 0.07 V versus Li/Li+ charge. The line 184 depicts the half-cell potential (V versus Li/Li+) of the graphite electrode as it is charged from an initial half-cell potential of about 1.2 V versus Li/Li+ to 0.001 V versus Li/Li+ resulting in a gravimetric capacity of about 0.38 Ah/$g_{Graphite}$. The line 186 depicts the half-cell potential (V versus Li/Li+) of the graphite electrode as it is discharged following the 0.001 V versus Li/Li+ charge.

FIG. 7 is an expanded view of the end of the charge curves and the initial portion of the discharge curves of FIG. 6. From FIGS. 6 and 7 it is shown that the additional charge to 0.001 V versus Li/Li+ resulted in an additional capacity of 21 mAh/$g_{Graphite}$ which amounts to about 5% of the total capacity of the electrode when a full state of charge (SOC) of the electrode is defined to be 0.070 mV corresponding to a $Li_{0.95}C_6$ stoichiometry.

Additionally, FIG. 6 reveals three "plateaus" 187, 189, and 191 during charge, and three "plateaus" 188, 190, and 192 during discharge. As evidenced by FIG. 7, when the electrode is charged to 0.001 V versus Li/Li+, which is beyond the charging plateau 191 which is associated with graphite's surface stoichiometry of $Li_{0.95}C_6$ and which terminates at about 70 mV versus Li/Li+, the termination of the plateau 192 occurs earlier in the discharge as evidenced by a 2 mAh/$g_{Graphite}$ shift 194 to the right in the discharge line 186. With this slight exception, both the charge lines 180 and 184 and the discharge lines 182 and 184 are consistent with each other.

By combining the SiO, which is a material that displays an apparent thermodynamic hysteresis in the potential versus capacity curve, with the graphite, a combination of the properties revealed in FIGS. 4-7 is revealed as discussed with reference to FIGS. 8 and 9. In FIG. 8, the line 200 depicts the half-cell potential (V versus Li/Li+) of a mixed graphite/SiO electrode with a total lithiation capacity of 440 mAh/$g_{SiOGr}$ as the electrode is charged from an initial half-cell potential of about 1.25 V versus Li/Li+ to about 0.07 V versus Li/Li+ resulting in a gravimetric capacity of about 0.42 Ah/$g_{SiOGr}$. The line 202 depicts the half-cell potential (V versus Li/Li+) of the mixed electrode as it is discharged following the 0.07 V versus Li/Li+ charge. The line 204 depicts the half-cell potential (V versus Li/Li+) of the mixed electrode as it is charged from an initial half-cell potential of about 1.25 V versus Li/Li+ to 0.001 V versus Li/Li+ resulting in a gravimetric capacity of about 0.44 Ah/$g_{SiOGr}$. The line 206 depicts the half-cell potential (V versus Li/Li+) of the graphite electrode as it is discharged following the 0.001 V versus Li/Li+ charge. As is evident from FIG. 9, after the charge to 0.07 V versus Li/Li+, the initial discharge voltage 205 is about 0.077 V versus Li/Li+, while after the charge to 0.001 V versus Li/Li+, the initial discharge voltage 207 is about 0.013 V versus Li/Li+.

FIG. 9 is an expanded view of the end of the charge curves and the initial portion of the discharge curves of FIG. 8. From FIGS. 8 and 9 it is shown that the additional charge to 0.001 V versus Li/Li+ resulted in an additional capacity of 27 mAh/$g_{SiOGr}$ which amounts to about 6% of the total capacity of the electrode when full SOC is defined as 0.070 mV versus Li/Li+.

Additionally, FIG. 8 reveals that the three "plateaus" 187, 189, and 191 of FIG. 6 are still observable as plateaus 209, 211, and 213. Likewise, the three "plateaus" 188, 190, and 192 of FIG. 6 (the graphite electrode) are still observable as plateaus 208, 210, and 212. As evidenced by FIG. 9, when the electrode is charged to 0.001 V versus Li/Li+, the termination of the plateau 212, occurs earlier in the discharge as evidenced by a 9 mAh/$g_{SiOGr}$ shift 214 to the right in the discharge line 206 compared to the discharge line 202. With this exception, both the charge lines 180 and 184 and the discharge lines 182 and 184 are consistent with each other.

The shift 214 occurs as a result of the apparent thermodynamic hysteresis. In particular, SiO continues to lithiate at potentials below 0.070 V versus Li/Li+, the termination of the charging plateau 191 of FIG. 7, as evidenced by FIG. 5. SiO does not begin to delithiate substantially, however, until potential rises above around 0.2 V versus Li/Li+ as evidenced by the knee 216 in the discharge line 176 of FIG. 4. Accordingly, it is possible to verify if the lithiation potential of the negative electrode, also referred to as $\phi_a{}^*$, dropped below 70 mV versus Li/Li+, whereat graphite's surface has a stoichiometry above $Li_{0.95}C_6$, by monitoring for the shift 214. The character of the shift further allows an estimate of the final lithiation half-cell surface potential of the negative electrode as discussed more fully below.

Figure 10:
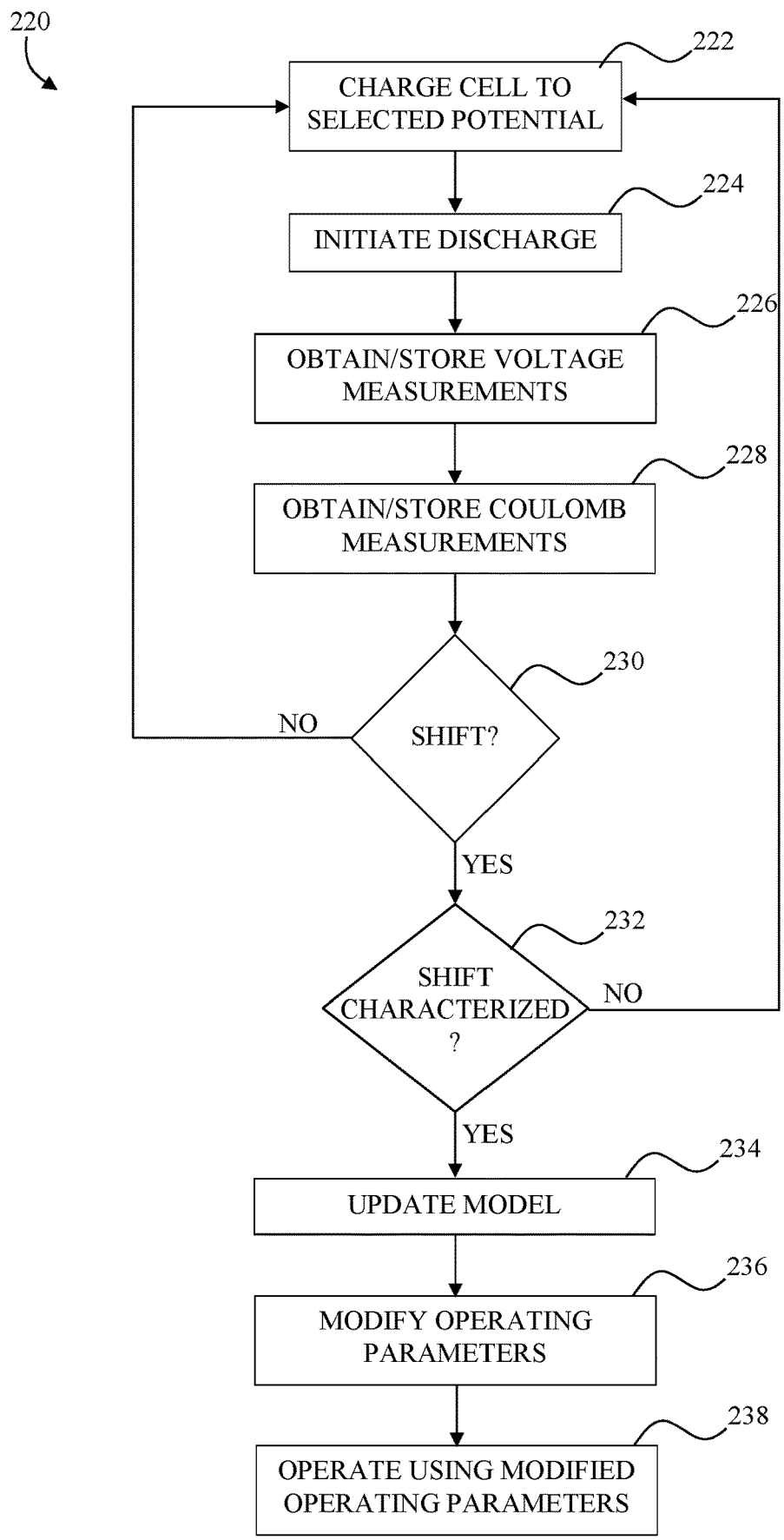
FIG. 10 depicts a flow chart of a procedure which is used to modify a model so as to generate optimized operating parameters in a BMS.

The method 220 of FIG. 10 is executed at least in part by the BMS 128 in one embodiment to identify the shift 214 in a battery cell incorporating a negative electrode with a material with lithiation/delithiation potential below 0.2 V versus Li/Li+ and a material that displays an apparent thermodynamic hysteresis in the potential versus capacity curve, typically with the material with lithiation/delithiation potential below 0.2 V versus Li/Li+(e.g. a carbon-based active material such as graphite) as the main active material. The method in some embodiments is performed in an operational or "online" environment such as while controlling the operation of a vehicle. In other embodiments, the method is performed in an experimental or "offline" environment such as in generating and validating experimental internal state prediction models.

At block 222 the battery cell is charged to a full cell potential. Once the cell has been charged to the selected full cell potential, at block 224 battery discharge is initiated. During the discharge, the cell potential for the cell (or cells) is obtained by obtaining the voltage between the negative electrode 156 and the positive electrode 152 using the sensor suite 140 and the obtained voltage is stored in the memory 136. (Block 226). The discharged coulombs are also obtained through the sensor suite 140 and stored in the memory 136 (block 228).

At block 230 the BMS compares the obtained/stored voltage and coulomb data from the present discharge to data stored from a previous discharge, if any, to ascertain if a shift 214 is evidenced. If there is no shift, then both the newly obtained data and the stored data are associated with the same discharge line 202 or 206 of FIGS. 8/9. Accordingly, the process returns to block 222 and a second charge is performed. In some embodiments, a significant period of time will elapse between the first charge and the second charge. For example, when the BMS is at least partially implemented at a service facility, the second charge may occur months after the initial charge. During initial testing of a battery cell, the second charge may occur immediately after the first discharge.

One or more parameters for the second charge in some embodiments are controlled by the controller 134 to vary from the parameters of the first charge. By way of example, during initial testing of the cell, the first charge in some embodiments is limited so as to ensure that the half-cell potential does not go below 0.070 V versus Li/Li+. This ensures that the obtained discharge data is in the form of the discharge curve 202. The full cell potentials for ensuing charges (block 222) are then increased in amount (Ah) until the shift 214 is observed. In some embodiments, the initial charge places the half-cell potential below 0.070 V versus Li/Li+, and ensuing charges are reduced until the shift is observed. In either approach, initial characterization of the half-cell is provided.

Once the shift is observed at block 230, the process proceeds to block 232 and the BMS determines if sufficient data has been collected to parameterize the relationship between the shift and the difference in voltage. Specifically, the observed shift is related to the extent to which the voltage of the electrode has been driven below graphite's third plateau of ~70 mV versus Li/Li+(or any other selected reference voltage). As a result of such a charge, the voltage of the cell at initial discharge is lower versus Li/Li+ as evidenced by the shift between the voltage 205 and the voltage 207 of FIG. 9. This relationship is provided by the following equation:

$$\Delta_{shift} = Q(\Delta V)$$

wherein V is the shift in voltage at the initial discharge. Accordingly, for smaller excursions below the reference voltage during a charge event, a smaller shift will be exhibited since the initial discharge voltage will be closer to the voltage 205. Conversely, as the charge voltage approaches 0 mV versus Li/Li+, the observed shift is maximized and is closer to the voltage 207. Accordingly, if sufficient data has not been collected for the desired level of parameterization at block 232, the process returns to block 222 and additional data is obtained at a different potential. After the initial parameterization, parameterization is typically repeated at intervals throughout the life of the cell since the electrode components typically age at different rates and thus the percentage contribution to total capacity will change. The particular interval selected for repeated parameterization will depend upon the desired accuracy as well as the relative change in component aging.

If at block 232 sufficient shift data has been obtained, the process continues to block 234. In some settings, especially operational settings, only data associated with a single shift is needed. Accordingly, the block 232 is essentially omitted.

At block 234, following parameterization, if any, a model of the electrode which is stored in the memory 136 for execution by the controller 134 is updated with the data obtained at blocks 222-232. By way of example, since the function "Q" is a relationship which is parameterized through experiments for a given battery anode composite, once the shift 214 is observed during de-lithiation, the lithiation extent of the graphite surfaces during the immediately preceding charge can be accurately determined through the function "Q".

Moreover, by comparing the coulombs needed to reach one or more of the three graphite plateaus 208, 210, and 212 during the discharge of the battery to the coulombs passed during the previous charge to reach the associated plateau or plateaus, it is possible to: a) verify whether graphite's surface stoichiometry increased above $Li_{0.95}C_6$ and b) estimate the additional capacity obtained from the second component, which displays an apparent thermodynamic hysteresis in the potential versus capacity curve.

While a number of models have been developed for use in battery management systems as discussed in U.S. Pat. No. 8,188,715 which issued May 29, 2012, U.S. Pat. No. 7,518,339 which issued Apr. 14, 2009, and U.S. Pat. Appl. Publication No. 2018/0083461, the contents of which are each incorporated herein by reference, in one embodiment an anode model for a lithium ion battery anode stored in the memory 136 is based upon a typical structure of a physics based Li-ion battery model. The model is defined by the following:

$$p^* = \underset{p \in P}{\mathrm{argmin}} \sum_{i=1}^{N} J_i(y_{model,i}, y_{exp,i})$$

$$\text{s.t } \dot{x}_i(t) = f(x_i(t), z_i(t), u(t), p)$$

$$0 = g(x_i(t), z_i(t), u(t), p)$$

$$y_{model,i}(t) = h(x_i(t), z_i(t), u(t), p)$$

$$x_i(0) = X_i(y_{exp,i}(0), p)$$

In this model, J is the cost function, x and z refer to the differential and algebraic states of the model, u is the cell voltage, f, g, and h refer to the functions that form the electrochemical model structure, i refers to the experiment number, $X_i$ refers to the initial condition of the $i^{th}$ experiment, $p^*$ is the result of the optimization problem and the set P defines the upper and lower limits for the parameter variation. The functions f, g, h are derived using model order reduction techniques from the physics based Li-ion battery model, which consists of coupled partial differential equations.

Beginning with the model above, the anode voltage at a given time generated by the model is output as $y_{model} = [V_{model}, T_{model}]$ (for simplicity the experiment subscript "i" in this section is omitted) and the anode voltage at a given time obtained by experiment are provided as $y_{exp} = [V_{exp}, T_{exp}]$. The structure of the cost function is typically given by:

$$J = w_1 |V_{model} - V_{exp}|_2 + w_2 |T_{model} - T_{exp}|_2$$

wherein $w_1$ and $w_2$ are weights. However, by using the experiments that identify the magnitude of shift in the de-lithiation plateau, the cost function can be modified to include more information on the internal states of the system.

For example, one such modification is:

$$J = w_1 |V_{model} - V_{exp}|_2 + w_2 |T_{model} - T_{exp}|_2 + w_3 |\alpha(z) - \alpha_{exp}|$$

wherein $$\alpha_{exp} = Q^{-1}(\Delta_{shift}) - \nu_{ref}$$

In this model, the function a is defined as the minimum of the anode over-potential states for a particular charge cycle and thus contains information about the minimum negative electrode surface potential prediction from the model during charge. An example structure for the function is:

$$\alpha(z) = \min(z_k)$$

wherein during charge $z_k$ refers to a state in the vector z. In obtaining the experimental values for the model above, the $\Delta_{shift}$ is determined for each experiment by detecting the features during a slow full cell discharge.

Once the model is updated, the updated model is used to modify one or more operating parameters for the cell. (Block 236). As used herein, the term "operating parameters" means one or more of charge and discharge set points (e.g., charging voltage, charging current rate, discharge current rate, charge termination voltage, charge termination current, etc.), maximum voltage, minimum voltage, state of charge, depth of charge, temperature, and capacity. Accordingly, to account for loss of capacity as a cell ages, one battery management strategy is to reduce the operating regime of the battery. In particular, the maximum steady state battery voltage is decreased over time. Accordingly, in one embodiment the boundary conditions of the operating regime for the battery are modified at block 236. Accordingly, since lithium-plating behavior is a well-studied aging mechanism and safety issue, by detecting when the graphite's surface SOC rises above $Li_{0.95}C_6$, and modifying the maximum operating voltage of the battery based upon the updated model, the battery can be safely operated by the controller 124 at potentials close to but not in the lithium plating regime of the battery (i.e., half-cell potential of 0 mV versus Li/Li+ and graphite's surface composition of $Li_{1.00}C_6$). This minimizes deterioration of the battery while maximizing available capacity.

In accordance with one embodiment, the updated model data is used by the controller 134 at block 236 to improve model voltage prediction, power prediction, and SOC estimation accuracy. Specifically, the model internal states that correlate with graphite's surface stoichiometry increasing above $Li_{0.95}C_6$ (see, e.g., FIG. 6) are used to indicate which proportion of the delithiation capacity results from graphite and which from the second component that displays the apparent thermodynamic hysteresis since the relative proportions are related to the difference between the charging and discharging capacities for the regions associated with the third plateau (213/212) related to graphite. The updated data enables more accurate SOC and voltage prediction for the model. Thus, the controller 134 controls the display 144 to provide more accurate SOC data to a user. In some embodiments, the SOC data is in the form of a cruising range.

In one or more embodiments, the method 220 is modified to calibrate BMS limits for charging as well as the charging strategies performed by the BMS 128 in an operational environment without modifying a model. Thus, the block 234 is omitted and the process simply continues to block 236 whereat the updated data is used by the controller 134 to adapt empirical fast charging algorithms stored in the memory 136 in the absence of an extensive electrochemical model. The adaptation is made on a cycle-by-cycle basis after the shift 214 is detected during the subsequent discharge. Accordingly, in the next charge cycle, the controller 134 uses the updated model data to adapt the parameters for the fast charging algorithm leading to an iterative learning control process. In particular, the knowledge of what full cell potential corresponds to graphite's surface stoichiometry of $Li_{0.95}C_6$ is used to adapt the maximum voltage of the battery and/or cutoff criterion during fast charging to achieve fast charging, while minimizing aging of the battery. Thus, the updated data is used in various embodiments by the controller 134 to establish a voltage value for constant voltage hold, establish a voltage cut-off value for a constant current charge, establish the set-point for charge capacity, establish the boundary of the healthy operating regime, etc. Of course, in some embodiments wherein the block 234 is performed, the above parameters are likewise modified.

In any event, once desired modified parameter or parameters have been stored in the memory, the controller 134 operates the cell/battery pack using the modified parameters at block 238.

As noted above, the method 220 in some embodiments is used for parameterization and validation of electrochemical battery models. Parameterization often requires electrical testing that spans the operating regime of the battery along with specialized electrochemical tests. Typically, the signals available for quantifying the performance of battery models are voltage and temperature. Due to the significantly large number of parameters required for an electrochemical model simulation, many parameters are simply forced to fit the model predictions with minimal experimental data. Challenges in the optimization problem include occurrences of local minima, insufficient data quality for identifying certain model parameters, and structural challenges in the model that make certain parameters not uniquely identifiable. Consequently, different groups of parameters can result in similar voltage and temperature predictions from the model.

The accuracy of the fitted parameters/model quality can be determined by parameter specific electrochemical experiments. However, such experiments can be time-consuming and for some parameters the available methods are not always directly applicable or well refined. An alternative approach to further assess model quality is to measure internal states of the battery such as negative electrode/electrolyte potentials. Access to such measurements typically requires specialized cell design with multiple reference electrodes. In the case of a battery containing multi-component negative electrodes consisting of a material with lithiation/delithiation potential below 0.2 V versus Li/Li+ such as graphite and a second material that displays an apparent thermodynamic hysteresis in the potential versus capacity curve (e.g., SiO or other Si-based materials), it is possible to partially validate the internal state prediction of the model by detecting specific electrochemical features in accordance with the method 220. These features (e.g., the shift 214) indicate whether the potential of the multi-component negative electrode decreased below the third plateau of graphite of approximately ~70 mV versus Li/Li+.

Accordingly, the addition of a material that displays an apparent thermodynamic hysteresis in the potential versus capacity curve, which in this example was SiO but can be any such material including other Si alloys, and others, to an electrode including a material with lithiation/delithiation potential below 0.2 V versus Li/Li+ such as a carbon-based active material, e.g., graphite, results in an electrode which exhibits a readily discernible electrochemical feature when the electrode is charged beyond 0.07 V versus Li/Li+. The apparent thermodynamic hysteresis in the potential versus capacity curve is used to partially validate the electrochemical model for lithium-ion batteries with negative electrodes that contain silicon (Si), silicon oxide (SiO), and Si alloys such as silicides and other materials that display an apparent thermodynamic hysteresis. Further, the apparent thermodynamic hysteresis in the potential versus capacity curve is used to identify and update the BMS and BMS strategies based on the partially validated electrochemical model.

In addition to updating BMS strategies, the apparent thermodynamic hysteresis in the potential versus capacity curve is used in the design of BMS strategies. By way of example, in a lithium-ion battery with a multi-component negative electrode consisting of a material with lithiation/delithiation potential below 0.2 V versus Li/Li+ such as a carbon-based active material, e.g., graphite, and a second material, which displays an apparent thermodynamic hysteresis in the potential versus capacity curve, the electrochemical features associated with the apparent thermodynamic hysteresis are used to partially validate an internal state of a battery model, adapt battery model parameters to better predict internal states, enable improved voltage prediction as well as accuracy of SOC estimation and power prediction, adapt battery limits over life time to control battery aging behavior (e.g., specify one or more boundaries of a healthy operating regime), and specify charging strategies based on measurable electrochemical features in the absence of an electrochemical model or without resorting to running such a model.

The charging strategies implemented in various embodiments include specifying a voltage for a constant voltage hold, specifying a voltage cut-off value for a constant current charge, specifying a set-point for charge capacity, and specifying a boundary of a healthy operating regime.

The disclosed system and method in one embodiment are used in experimental design to partially validate internal state predictions of a model of a lithium-ion battery containing a multi-component negative electrode consisting of a material with lithiation/delithiation potential below 0.2 V versus Li/Li+ such as a carbon-based active material, e.g., graphite, and a second component, such as SiO, which displays apparent thermodynamic hysteresis in the potential versus capacity curve. In some embodiments validation takes place through detection and measurement of capacity accessed below e.g., graphite's third plateau of ~70 mV. This accessed capacity is attributed to the second component, which displays apparent thermodynamic hysteresis. The disclosed system and method in one embodiment are used for the adaptation of battery model parameters to better predict internal states using the apparent thermodynamic hysteresis behavior of the component which displays apparent thermodynamic hysteresis.

While described primarily with reference to a lithium ion battery, the disclosure is useful in other cell types such as Na-ion, Mg-ion so long as the negative electrode contains silicon, silicon-based materials (SiO, Si alloys, and others), and/or other materials that display an apparent thermodynamic hysteresis in the potential versus capacity curve during lithiation/delithiation.

Accordingly, it will be appreciated that variants of the above-described and other features and functions, or alternatives thereof, may be desirably combined into many other different systems, applications or methods. Various presently unforeseen or unanticipated alternatives, modifications, variations or improvements may be subsequently made by those skilled in the art that are also intended to be encompassed by the foregoing disclosure.

What is claimed is:

1. A battery system comprising:
a cell including a cathode and an anode, the anode including a carbon-based active material and a minor active material that displays an apparent thermodynamic hysteresis in a potential versus capacity curve;
a memory including program instructions stored therein; and
a controller operably connected to the memory and configured to execute the program instructions to
perform a first charge of the cell to a first potential,
perform a first discharge of the cell from the first potential to generate a first discharge versus capacity curve,
perform a second charge of the cell to a second potential,
perform a second discharge of the cell from the second potential to generate a second discharge versus capacity curve,
identify a shift between the first discharge versus capacity curve and the second discharge versus capacity curve,
update a model of the cell based upon the identified shift,
store at least one modified operating parameter of the cell in the memory based upon the updated model, and
operate the cell under the control of the controller based upon the stored at least one modified operating parameter.

2. The system of claim 1, wherein the controller is further configured to execute the program instructions to:
parameterize a relationship between the shift and a difference in voltage between the first potential and the second potential, wherein the first potential is about 70 mV versus lithium/lithium+ and the second potential is lower than 70 mV versus lithium/lithium+.

3. The system of claim 2, wherein the at least one operating parameter includes a capacity of the cell, wherein the controller is further configured to execute the program instructions to:
determine a state of charge of the cell based upon the modified capacity.

4. The system of claim 3, wherein:
the system further includes a display; and
the controller is further configured to execute the program instructions to display the determined state of charge on the display.

5. The system of claim 1, further comprising a coulomb counter, wherein the controller is further configured to execute the program instructions to:
identify a first number of coulombs discharged between initiation of the first discharge and an end of a first discharge plateau of the first discharge versus capacity curve;
identify a second number of coulombs discharged between initiation of the second discharge and an end of a second discharge plateau of the second discharge versus capacity curve;
compare the first number of coulombs to the second number of coulombs; and
estimate an amount of coulombs associated with the minor active material resulting from charging the cell to the second potential, wherein the first potential is about 70 mV versus lithium/lithium+ and the second potential is lower than 70 mV versus lithium/lithium+.

6. The system of claim 2, wherein the at least one operating parameter includes a charging voltage cutoff, the system further comprising:
a voltage meter operably connected to the controller and the cell, wherein the controller is further configured to execute the program instructions to:
terminate a third charge of the cell based upon the charging voltage cutoff.

7. The system of claim 2, wherein the at least one operating parameter includes a charging current cutoff, the system further comprising:
a current meter operably connected to the controller and the cell, wherein the controller is further configured to execute the program instructions to:
terminate a third charge of the cell based upon the charging current cutoff.

8. The system of claim 2, wherein the carbon-based active material includes graphite and the minor active material includes silicon.

9. The system of claim 1, further comprising a coulomb counter, wherein the controller is further configured to execute the program instructions to:
identify a first number of coulombs discharged between initiation of the first discharge and an end of a first discharge plateau of the first discharge versus capacity curve;
identify a second number of coulombs discharged between initiation of the second discharge and an end of a second discharge plateau of the second discharge versus capacity curve;
compare the first number of coulombs to the second number of coulombs; and
estimate an amount of coulombs associated with the minor active material resulting from charging the cell to the second potential, wherein the first potential is about 70 mV versus lithium/lithium+ and the second potential is lower than 70 mV versus lithium/lithium+.

10. A method of operating a battery system comprising:
performing a first charge of a cell including a cathode and an anode, the anode including a carbon-based active material and a minor active material that displays an apparent thermodynamic hysteresis in a potential versus capacity curve, to a first potential;
performing a first discharge of the cell from the first potential under the control of a controller executing program instructions stored in a memory to generate a first discharge versus capacity curve;
performing a second charge of the cell to a second potential;
performing a second discharge of the cell from the second potential to generate a second discharge versus capacity curve;
identifying with the controller a shift between the first discharge versus capacity curve and the second discharge versus capacity curve;

updating a model of the cell stored in the memory based upon the identified shift;

modifying with the controller at least one operating parameter of the cell based upon the updated model;

storing the at least one modified operating parameter of the cell in the memory; and operating the cell under the control of the controller based upon the stored at least one modified operating parameter.

11. The method of claim 10, further comprising:

parameterizing a relationship between the shift and a difference in voltage between the first potential and the second potential, wherein the first potential is about 70 mV versus lithium/lithium+ and the second potential is lower than 70 mV versus lithium/lithium+.

12. The method of claim 11, wherein:

the stored at least one modified operating parameter includes a modified capacity of the cell; and operating the cell under the control of the controller based upon the stored at least one modified operating parameter includes determining a state of charge of the cell based upon the stored modified capacity.

13. The method of claim 12, further comprising:

displaying the determined state of charge on a display.

14. The method of claim 11, wherein:

the stored at least one modified operating parameter includes a modified charging voltage cutoff; and operating the cell under the control of the controller based upon the stored at least one modified operating parameter includes terminating a third charge of the cell based upon the modified charging voltage cutoff.

15. The method of claim 11, wherein:

the stored at least one modified operating parameter includes a modified charging current cutoff; and operating the cell under the control of the controller based upon the stored at least one modified operating parameter includes terminating a third charge of the cell based upon the modified charging current cutoff.

16. The method of claim 10, further comprising:

identifying a first number of coulombs discharged between initiation of the first discharge and an end of a first discharge plateau of the first discharge versus capacity curve;

identifying a second number of coulombs discharged between initiation of the second discharge and an end of a second discharge plateau of the second discharge versus capacity curve;

comparing the first number of coulombs to the second number of coulombs; and estimating an amount of coulombs associated with the minor active material resulting from charging the cell to the second potential, wherein the second potential is lower than 70 mV versus lithium/lithium+.

17. A battery system comprising:

a cell including a cathode and an anode, the anode including a carbon-based active material and a minor active material that displays an apparent thermodynamic hysteresis in a potential versus capacity curve;

a memory including program instructions stored therein; and a controller operably connected to the memory and configured to execute the program instructions to perform a first charge of the cell to a first potential, perform a first discharge of the cell from the first potential to generate a first discharge versus capacity curve, perform a second charge of the cell to a second potential, perform a second discharge of the cell from the second potential to generate a second discharge versus capacity curve, identify a shift between the first discharge versus capacity curve and the second discharge versus capacity curve, modify at least one operating parameter based upon the identified shift, store the at least one modified operating parameter of the cell in the memory, and operate the cell under the control of the controller based upon the stored at least one modified operating parameter.

18. The battery system of claim 17, wherein the stored at least one modified operating parameter is a charging limit.

19. The battery system of claim 17, wherein the stored at least one modified operating parameter is a charging strategy.

* * * * *